(12) United States Patent
Chung et al.

(10) Patent No.: US 11,081,670 B2
(45) Date of Patent: Aug. 3, 2021

(54) DISPLAY DEVICE

(71) Applicant: Samsung Display Co., Ltd., Yongin-si (KR)

(72) Inventors: Ho Ryun Chung, Yongin-si (KR); Myung Hwan Kim, Yongin-si (KR); Sang Yeol Kim, Yongin-si (KR); Se Joong Shin, Yongin-si (KR); Chang Han Lee, Yongin-si (KR); Deok Hyeon Jang, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/748,077

(22) Filed: Jan. 21, 2020

(65) Prior Publication Data

US 2020/0287162 A1   Sep. 10, 2020

(30) Foreign Application Priority Data

Mar. 7, 2019  (KR) .................. 10-2019-0026404

(51) Int. Cl.

| H01L 51/52 | (2006.01) |
|---|---|
| H01L 27/32 | (2006.01) |
| H01L 51/50 | (2006.01) |
| H01L 33/30 | (2010.01) |
| H01L 51/00 | (2006.01) |

(Continued)

(52) U.S. Cl.
CPC ........ *H01L 51/5253* (2013.01); *H01L 25/167* (2013.01); *H01L 27/322* (2013.01); *H01L 27/3225* (2013.01); *H01L 27/3244* (2013.01); *H01L 27/3248* (2013.01); *H01L 27/3258* (2013.01); *H01L 27/3276* (2013.01); *H01L 33/30* (2013.01); *H01L 51/0097* (2013.01); *H01L 51/502* (2013.01); *H01L 51/5237* (2013.01); *G02F 1/136222* (2021.01); *H01L 2251/301* (2013.01); *H01L 2251/5338* (2013.01)

(58) Field of Classification Search
CPC ..................... H01L 27/3244; H01L 27/3258
See application file for complete search history.

(56) References Cited

U.S. PATENT DOCUMENTS 9,419,065 B2   8/2016 Degner et al.
10,242,975 B2   3/2019 Kim
(Continued)

FOREIGN PATENT DOCUMENTS

| JP | 2018-60202 A | 4/2018 |
| KR | 10-1621661 B1 | 5/2016 |
| KR | 1020170116632 A | 10/2017 |

OTHER PUBLICATIONS

Kim et al., "Fabrication of Flexible micro-LED Display using Adhesive film-based Transfer Technology", IMID Digest 2018, 404.

*Primary Examiner* — Farun Lu
(74) *Attorney, Agent, or Firm* — Cantor Colburn LLP

(57) ABSTRACT

A display device includes: a substrate; a light emitting element layer including a first light emitting element in a first display area of the substrate, and a second light emitting element in a second display area of the substrate; and a thin-film encapsulation layer formed on the light emitting element layer. The first light emitting elements may include a first electrode, an organic light emitting layer, and a second electrode. The second light emitting elements may include a first electrode, an inorganic light emitting layer, and a second electrode.

18 Claims, 10 Drawing Sheets

(51) Int. Cl.
*H01L 25/16* (2006.01)
*G02F 1/1362* (2006.01)

(56) References Cited

U.S. PATENT DOCUMENTS

2018/0095502 A1 4/2018 Yamazaki et al.
2019/0165060 A1* 5/2019 Choi .................. H01L 51/0097

* cited by examiner

DISPLAY DEVICE

This application claims priority to Korean Patent Application number 10-2019-0026404, filed on Mar. 7, 2019, and all the benefits accruing therefrom under 35 U.S.C. § 119, the content of which in its entirety is herein incorporated in its entirety by reference.

BACKGROUND

(1) Field

Various embodiments of the disclosure relates to a display device.

(2) Related Art

Among display devices, organic light emitting display devices have attracted attention as next-generation displays due to advantages thereof including not only wide viewing angles and high contrast but also high response speeds. Generally, organic light emitting display devices may include thin-film transistors and organic light emitting diodes ("OLEDs") which are provided on a substrate, and may be operated in such a way that OLEDs autonomously emit light.

A light emitting diode ("LED") is a device that converts an electric signal into light, such as infrared light, visual light, etc., by using characteristics of a compound semiconductor, and may be used in home appliances, remote controllers, electronic display boards, various types of automation devices, etc. LEDs are becoming more widely used, for example, in electronic devices including not only relatively small hand-held electronic devices but also relatively large display devices.

SUMMARY

Various embodiments of the present disclosure are directed to a hybrid display device which complexly uses both an organic light emitting diode and a light emitting diode in a display area.

Various embodiments of the present disclosure are directed to a hybrid display device in which a light emitting element including an anode electrode, an organic light emitting layer and a cathode electrode is disposed in correspondence with a first area in the display device, and a light emitting element including an anode electrode, a light emitting unit, and a cathode electrode is disposed in correspondence with a second area in the display device.

In various embodiments of the present disclosure, the first area may be a display area, and the second area may be one or more among a peripheral area, a bending area and a folding area.

Various embodiments of the present disclosure are directed to a display device in which a through hole is provided in the peripheral area.

An embodiment of the present disclosure may provide a display device including: a substrate; a light emitting element layer including a first light emitting element disposed in a first display area of the substrate, and a second light emitting element disposed in a second display area of the substrate; and a thin-film encapsulation layer on the light emitting element layer. The first light emitting element may include a first electrode, an organic light emitting layer and a second electrode. The second light emitting element may include a first electrode, an inorganic light emitting layer and a second electrode.

In an embodiment, the inorganic light emitting layer may include a light emitting unit. The light emitting unit may include: a first conductive semiconductor layer doped with a first conductive dopant; a second conductive semiconductor layer doped with a second conductive dopant; and an active layer disposed between the first conductive semiconductor layer and the second conductive semiconductor layer.

In an embodiment, the light emitting unit may be oriented such that either the first conductive semiconductor layer or the second conductive semiconductor layer contacts the first electrode of the corresponding second light emitting element, and the other contacts the second electrode of the corresponding second light emitting element.

In an embodiment, the light emitting unit includes a micro light emitting diode ("LED").

In an embodiment, the second display area may enclose the first display area.

In an embodiment, the display device may further include a color filter layer on the thin-film encapsulation layer and including a plurality of quantum dots.

In an embodiment, the color filter layer may include a color conversion filter which corresponds to the second light emitting element.

In an embodiment, the display device may further include a pad portion at which an integrated circuit chip is mounted, and a bending area at which the display device is bendable, the bending area coupling either the first display area or the second display area, to the pad portion.

In an embodiment, the display device may further include a through hole in the second display area, and passing through the substrate and the thin-film encapsulation layer.

In an embodiment, the first display area may be provided in plurality to define a plurality of sub-areas, and the second display area may be provided between the plurality of sub-areas.

In an embodiment, the thin-film encapsulation layer may include a plurality of inorganic layers.

In an embodiment, the thin-film encapsulation layer may include an organic layer disposed between the plurality of inorganic layers, in the first display area.

In an embodiment, the first light emitting element may include an organic light emitting diode.

An embodiment of the present disclosure may provide a display device including: a substrate; a first light emitting element in a first display area of the substrate; and a second light emitting element in a second display area of the substrate. The first light emitting element may include an organic light emitting layer. The second light emitting element may include an inorganic light emitting layer.

In an embodiment, a light emitting unit may be disposed in the inorganic light emitting layer. The light emitting unit may include: a first conductive semiconductor layer doped with a first conductive dopant; a second conductive semiconductor layer doped with a second conductive dopant; and an active layer disposed between the first conductive semiconductor layer and the second conductive semiconductor layer.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
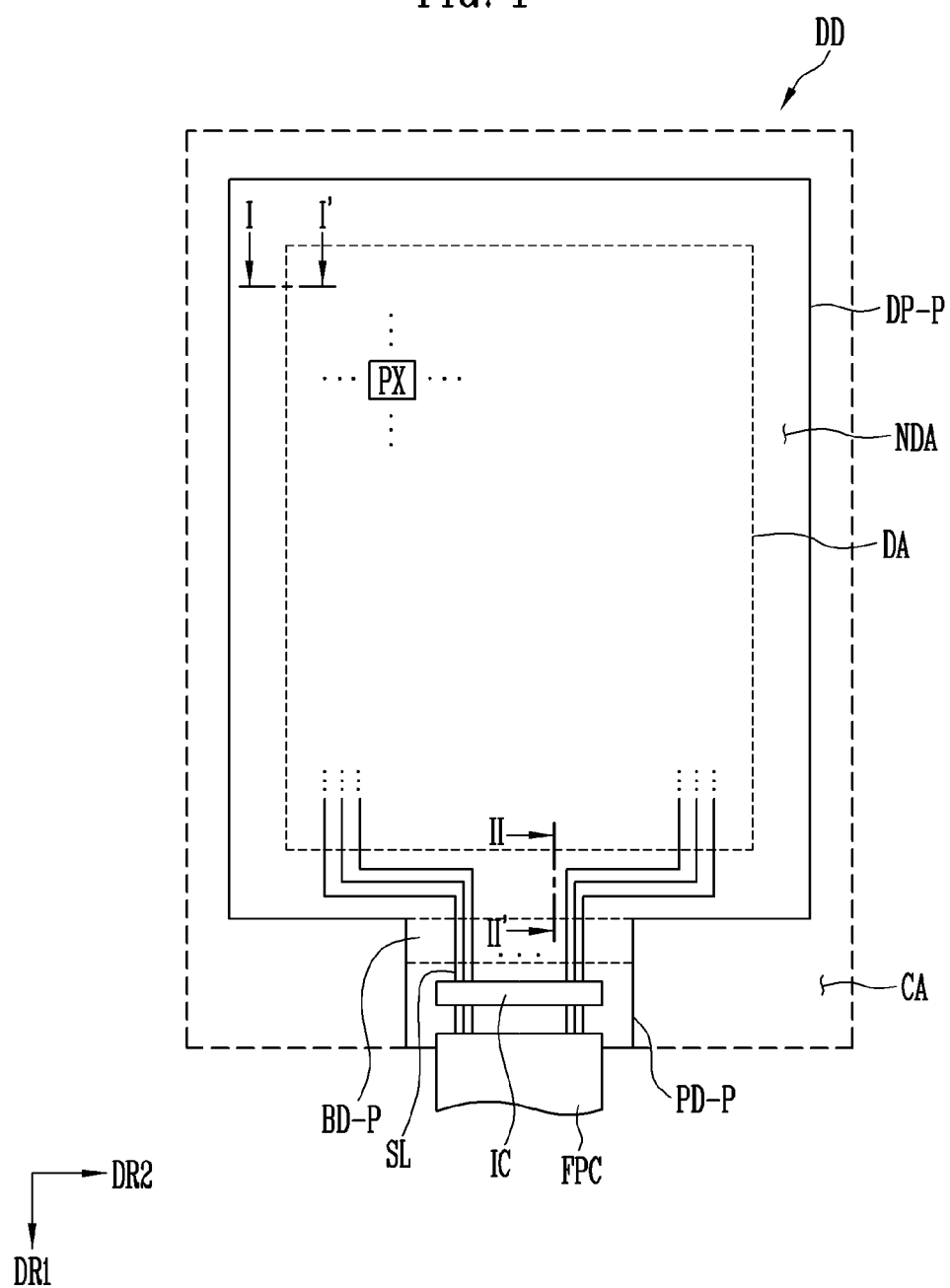
FIG. 1 is a plan view schematically illustrating an embodiment a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "connected" or "coupled" to another element, it can be directly connected or coupled to the another element or be indirectly connected or coupled to the another element with one or more intervening elements interposed therebetween. In contrast, when an element is referred to as being related to another element such as being "directly connected" or "directly coupled" to another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display device and a method for controlling a color gamut of the display device will be described in detail with reference to the accompanying drawings.

Figure 2:
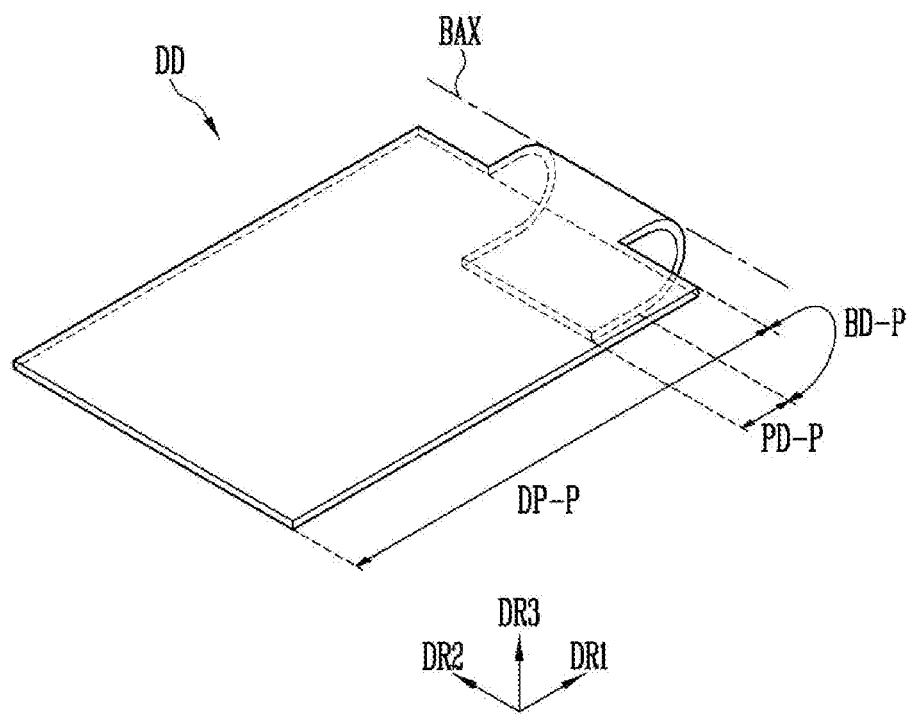
FIG. 2 is a perspective view illustrating the display device of FIG. 1, which is bent.

FIG. 1 is a plan view schematically illustrating an embodiment of a display device DD. FIG. 2 is a perspective view illustrating the display device DD of FIG. 1, which is folded.

Referring to FIG. 1, the display device DD may include a display portion DP-P, a bending portion BD-P, and a pad portion PD-P. The display device DD and components thereof, are bendable at the bending portion BD-P.

The display portion DP-P generates and displays an image, such as using light for displaying the image. The display portion DP-P includes a display area DA and a peripheral area NDA on a plane. The peripheral area NDA is adjacent to the display area DA and may enclose the display area DA such as to surround the display area DA in a plan view. An image is displayable or light is emittable at both the display area DA and the peripheral area NDA, without being limited thereto. The peripheral area NDA may extend to the edge of the display device DD, such that an outer edge of the peripheral area NDA corresponds to an outer edge of the display device DD.

The display portion DP-P may include a pixel PX provided in plurality (e.g., a plurality of pixels PX, pixels PX or a plurality of sub-pixels). In various embodiments, the plurality of pixels PX may be disposed in both the display area DA and the peripheral area NDA. The plurality of pixels PX may be driven or controlled to generate and/or emit light, to generate and/or display an image, etc. without being limited thereto.

In various embodiments, the display area DA may be defined in an internal area of the display portion DP-P relative to edges of the display device DD, and the peripheral area NDA may be defined along a periphery of the display area DA such as being closer to the edges of the display device DD than the display area DA. The peripheral area NDA may be considered an edge portion of the display device DD.

Although FIG. 1 illustrates the display area DA has a in a rectangular shape, the planar shape of the display area DA is not limited thereto. In other words, in various embodiments, the display area DA may have a circular shape, an elliptical shape, or a polygonal (e.g., hexagonal) shape, along a plane (e.g., a planar shape).

The display portion DP-P may include various signal lines through which electrical signals such as driving signals, power signals, control signals, etc. are transmitted to the plurality of pixels PX. The signal lines of the display portion DP-P may include, but are not limited to, gate lines (not illustrated), data lines (not illustrated), emission lines (not illustrated), a control signal line (not illustrated), an initialization voltage line (not illustrated), and a voltage line (not illustrated).

The gate lines may be respectively coupled to corresponding ones of the pixels PX among the plurality of pixels PX. The data lines may be respectively coupled to corresponding ones of the pixels PX among the plurality of pixels PX. Each of the emission lines may be arranged in parallel with a corresponding one of the gate lines. The control signal line may provide control signals to a gate driving circuit (not illustrated). The initialization voltage line may provide an initialization voltage to the plurality of pixels PX. The voltage line may be coupled to the plurality of pixels PX, and provide a first voltage to the plurality of pixels PX.

A number of the gate lines, the data lines, the emission lines, the control signal line, the initialization line, and the voltage line may be disposed in or on a same layer within the display portion DP-P, and while others among the aforementioned signal lines may be disposed in or on different layers.

A driving chip IC and a flexible printed circuit board FPC may be mounted on the pad portion PD-P.

The driving chip IC may be electrically coupled with a terminal of the pad portion PD-P. The driving chip IC may provide a driving signal and data to the pixels PX of the display area DA. The driving chip IC and the pad portion PD-P may be electrically coupled with each other through an anisotropic conductive film ("ACF"), without being limited thereto. In an embodiment, the driving chip IC and the pad portion PD-P may be electrically bonded to each other by a solder bump. The driving chip IC may be mounted on the pad portion PD-P in a chip on plastic ("COP") manner or a chip on glass ("COG") manner.

The flexible printed circuit board FPC may be electrically coupled with the pad portion PD-P. The flexible printed circuit board FPC may have flexible characteristics. The flexible printed circuit board FPC may transmit a control signal, etc. for controlling driving of the display portion DP-P. The flexible printed circuit board FPC and the pad portion PD-P may be electrically coupled with each other through an anisotropic conductive film ("ACF"). In an embodiment, electrical signals may be transmitted through the driving chip IC, from the flexible printed circuit board FPC to the display portion DP-P.

The bending portion BD-P may be disposed between the display portion DP-P and the pad portion PD-P. The bending portion BD-P may couple or connect the display portion DP-P and the pad portion PD-P to each other.

The bending portion BD-P may include a signal line SL provided in plurality (e.g., a plurality of signal lines SL, a plurality of lines SL or lines SL). The lines SL may couple signal lines of the display portion DP-P and signal lines of the pad portion PD-P to each other. The lines SL may extend to the display portion DP-P, and be coupled with the gate lines, the data lines, the emission lines, the control signal line, the initialization voltage line, and/or the voltage line.

In various embodiments, a plurality of pixels PX (not illustrated) may also be disposed in the bending portion BD-P. In these embodiments, the bending portion BD-P may be provided with gate lines (not illustrated), data lines (not illustrated), emission lines (not illustrated), a control line (not illustrated), an initialization voltage line (not illustrated), and a voltage line (not illustrated), which are coupled to a plurality of pixels PX (not illustrated) provided in the bending portion BD-P.

FIG. 1 illustrates the bending portion BD-P and the display portion DP-P at opposing ends of the display device DD as flat (e.g., not bent). The display portion DP-P, the bending portion BD-P, and the pad portion PD-P may be successively arranged along a first direction DR1. A second direction DR2 crosses the first direction DR1 and may define a plane along with the first direction DR1.

A width of the display portion DP-P is taken parallel with the second direction DR2 and may be greater than a width of the bending portion BD-P that is taken parallel with the second direction DR2. To form the bending portion BD-P having a width less than that of the display portion DP-P, a cutting area CA of a preliminary form of the display device DD having an overall rectangular shape, which expressed by a dotted line in FIG. 1, may be removed. That is, the cutting area CA is an area of the display device DD at which a portion of the display device DD is removed to form the bending portion BD-P having a width less than that of the display portion DP-P. In an embodiment, the cutting area CA may be separated from the preliminary form of the display device DD, such as by cutting using a laser cutting method or the like.

FIG. 2 is a perspective view illustrating the bending portion BD-P of the display device DD of FIG. 1, which is bent. Referring to FIG. 2, the display device DD may include the display portion DP-P, the bending portion BD-P extending from the display portion DP-P, and the pad portion PD-P extending from the bending portion BD-P. As illustrated in FIG. 2, the bending portion BD-P may be bendable along a bending axis BAX lengthwise extending along the second direction DR2.

The display device DD may have a structure such that a portion of edges thereof corresponding to the first direction DR1 are bent along a third direction DR3 by the bending of the bending portion BD-P about the bending axis BAX. Although FIGS. 1 and 2 illustrate that at only one end of the display device DD along the first direction DR1, edges corresponding to the first direction DR1 and opposite to each other along the second direction DR2 are bent, the invention is not limited thereto. In various embodiments, for example, the display device DD may have a structure such that at both of two opposing ends along the first direction DR1, edges each corresponding to the first direction DR1 may be bendable along the third direction DR3, or may have structure such that at one or more ends along the second direction DR2, edges corresponding to the second direction DR2 may also be bendable along the third direction DR3.

Figure 3:
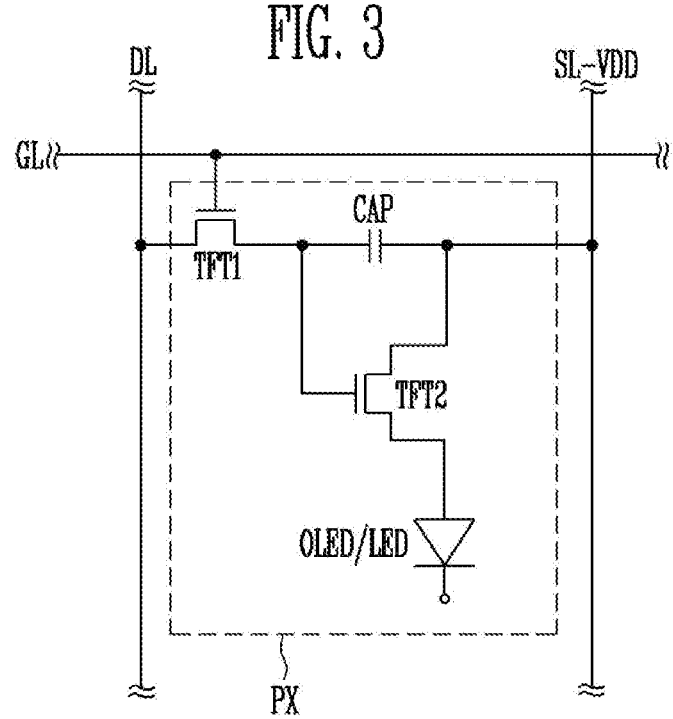
FIG. 3 is an equivalent circuit diagram of an embodiment of a pixel.

FIG. 3 is an equivalent circuit diagram of an embodiment of a pixel PX. FIG. 3 illustrates a pixel PX that is coupled to a gate line GL, a data line DL, and a voltage line SL-VDD. The configuration of the pixel PX is not limited thereto, and may be changed.

The pixel PX may include an organic light emitting diode ("OLED") or an inorganic light emitting diode (inorganic "LED") as a light emitting element. In various embodiments of the disclosure, the light emitting element of each of the pixels PX that are provided in the display area DA may be an organic light emitting diode OLED. The organic light emitting diode OLED may be a top emission diode or a bottom emission diode.

In various embodiments of the disclosure, a light emitting element OLED/LED of the pixels PX provided in the other areas (e.g., the peripheral area NDA and the bending portion BD-P) except the display area DA, may be a light emitting diode ("LED") including a light emitting unit. Other than the light emitting element, a structure of the pixels PX of the display area DA and of the other areas (e.g., the peripheral area NDA and the bending portion BD-P) may be the same. Here, the light emitting element of each of the pixels PX that are provided in the peripheral area NDA may be a micro light emitting diode ("LED") (e.g., MicroLED, micro-LED, mLED, μLED) having a size of, e.g., about 100 micrometers (μm) or less.

The pixel PX includes circuit elements for driving a light emitting element OLED/LED. A circuit (or circuit elements) of the pixel PX may include a first transistor TFT1 (e.g., a switching transistor), a second transistor TFT2 (e.g., a driving transistor), and a capacitor CAP.

The first transistor TFT1 may output a data signal applied to the data line DL, in response to a scan signal applied to the gate line GL. The capacitor CAP may charge a voltage corresponding to the data signal received from the first transistor TFT1.

The second transistor TFT2 is coupled to the light emitting element OLED/LED. The second transistor TFT2 may control electrical driving current flowing through the light emitting element OLED/LED based on the quantity of electric charge stored in the capacitor CAP. The organic light emitting diode OLED may emit light during a turn-on period of the second transistor TFT2.

Although FIG. 3 illustrates an example where each of the first transistor TFT1 and the second transistor TFT2 is provided or formed of an N-type transistor, the structure is not limited thereto. In other words, in various embodiments, each of the first transistor TFT1 and the second transistor TFT2 may be provided or formed of a P-type transistor such that the configuration illustrated in FIG. 3 may be correspondingly changed.

Figure 4:
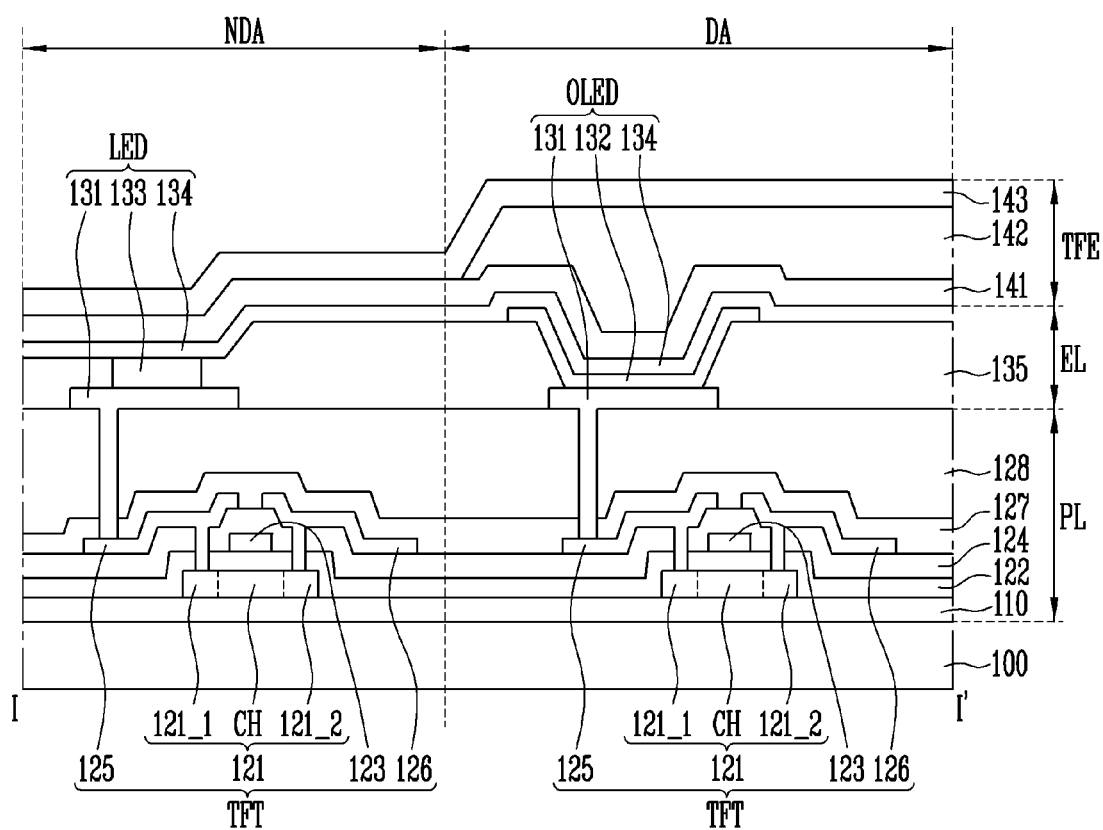
FIG. 4 is a cross-sectional view taken along line I-I' of FIG. 1.
Figure 5:
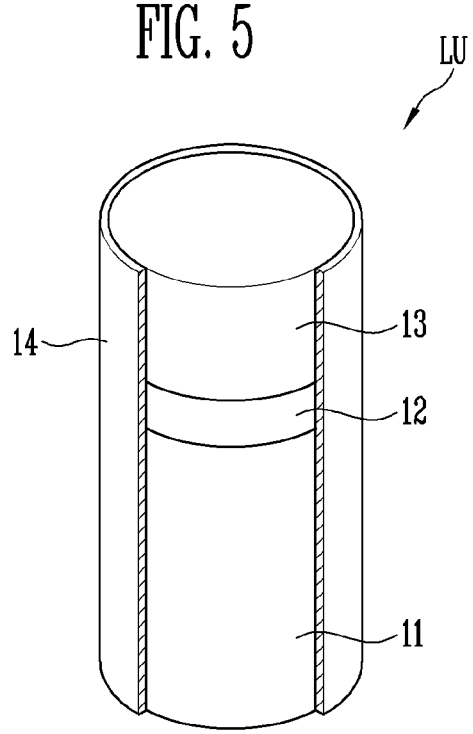
FIG. 5 is a perspective view illustrating an embodiment of a light emitting unit.

FIG. 4 is a cross-sectional view taken along line I-I' of FIG. 1. FIG. 5 is a diagram illustrating an embodiment of a light emitting unit.

Referring to FIGS. 1 and 4 together, the display device DD may include a substrate 100, and various elements and layers provided on the substrate 100. A vertical direction in FIG. 4 may be extended along the third direction DR3 described above, and may represent a thickness or thickness direction of the display device DD and/or components thereof.

The substrate 100 may be, e.g., a plastic substrate, a glass substrate, a metal substrate, or an organic/inorganic composite material substrate. In an embodiment, for example, the plastic substrate may include or be formed of at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin. In an embodiment, the substrate 100 may include or be formed of flexible material. As including a flexible material, the substrate 100 may be a substrate 100 including or formed of flexible glass or polymer material, or may be a substrate 100 including or formed of a flexible film. With respect to light transmission, the substrate 100 may be transparent, semi-transparent, or opaque.

The substrate 100 may include a display area DA and a peripheral area NDA, and these areas may correspond to the display area DA and the peripheral area NDA described above. In various embodiments of the disclosure, each of the display area DA and the peripheral area NDA may include pixels PX each of which includes a light emitting element OLED/LED. In these embodiments, each of the pixels PX that are provided in the display area DA may include an organic light emitting diode OLED as the light emitting element OLED/LED. Each of the pixels PX that are provided in the peripheral area NDA may include, as the light emitting element OLED/LED, a light emitting diode LED including or formed of a light emitting unit LU.

A pixel circuit layer PL and a light emitting element layer EL are disposed on the substrate 100.

The pixel circuit layer PL may include a buffer layer 110, and a transistor TFT disposed on the buffer layer 110.

The buffer layer 110 is disposed on the substrate 100 to reduce or effectively prevent impurities from penetrating into the transistor TFT. The buffer layer 110 may be provided as a single layer, or alternatively may have a multilayer structure including at least two or more layers. In the case where the buffer layer 110 has a multilayer structure, the respective layers may include or be formed of a same material or different materials. In various embodiments, the buffer layer 110 may be omitted depending on the material of the substrate 100 and/or processing conditions in forming the display device DD.

The transistor TFT may be a driving transistor for driving the light emitting element OLED/LED provided in the light emitting element layer EL, or a switching transistor for switching the driving transistor. The transistor TFT may include a semiconductor layer 121 disposed on the buffer layer 110, and a gate electrode 123 provided or formed over the semiconductor layer 121.

The semiconductor layer 121 may be disposed on the buffer layer 110. The semiconductor layer 121 may be a semiconductor pattern formed of polysilicon, amorphous silicon, an oxide semiconductor, etc.

The semiconductor layer 121 may include a first area 121_1 coupled to a first electrode of the transistor TFT, and a second area 121_2 coupled to a second electrode of the transistor TFT. In various embodiments, any one of the first area 121_1 and the second area 121_2 may be a source area, and the other one may be a drain area. The first area 121_1 and the second area 121_2 may be doped with impurities. A channel area CH which is not doped with impurities or has less impurities than that of the first area 121_1 and the second area 121_2, may be may be provided or formed between the first area 121_1 and the second area 121_2.

The gate electrode 123 may be disposed over the semiconductor layer 121. The gate electrode 123 may include or be formed of metal having relatively high electrical conductivity. Taking into account the compaction between adjacent layers, for example, the surface flatness of stacked layers, and the processability, the gate electrode 123 may be provided or formed to have a single layer structure or a multilayer structure, e.g., using one or more materials among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). Depending on an electrical signal applied to the gate electrode 123, the first area 121_1 and the second area 121_2 of the semiconductor layer 121 may be electrically connected to each other.

To secure the electrical insulating ability between the semiconductor layer 121 and the gate electrode 123, a gate insulating layer 122 may be interposed between the semiconductor layer 121 and the gate electrode 123. The gate insulating layer 122 may include or be formed of inorganic material such as silicon oxide or silicon nitride, and may have a single layer structure or a multilayer structure.

An interlayer insulating layer 124 may be provided or formed on the gate electrode 123. The interlayer insulating layer 124 may include or be formed of inorganic material, and may include or be formed of material identical with or different from that of the gate insulating layer 122. In an embodiment, for example, the interlayer insulating layer 124 may include or be formed of inorganic material such as silicon oxide or silicon nitride, and may have a single layer structure or a multilayer structure.

A source electrode 125 and a drain electrode 126 may be provided or formed on the interlayer insulating layer 124.

The source electrode 125 and the drain electrode 126 may be electrically connected to the semiconductor layer 121 at or through contact holes that are provided or formed in the interlayer insulating layer 124 and the gate insulating layer 122. In an embodiment, for example, taking into account electrical conductivity, the source electrode 125 and the drain electrode 126 may include or be formed of one or more materials of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may have a single layer structure or a multilayer structure In various embodiments, a passivation layer 127 may be provided or formed on the source electrode 125 and the drain electrode 126. The passivation layer 127 may include or be formed of organic or inorganic material.

A planarization layer 128 may be provided or formed on the passivation layer 127. The planarization layer 128 may include or be formed of organic or inorganic material. The planarization layer 128 may make a top surface of the transistor TFT substantially planar, and function to protect various elements of the transistor TFT. The planarization layer 128 may include be formed of, e.g., acryl-based organic material or benzocyclobutene ("BCB").

The light emitting element layer EL may be provided or formed on the planarization layer 128. In the display area DA, the organic light emitting diode OLED including an organic light emitting layer may be disposed in the light emitting element layer EL. In the peripheral area NDA, the light emitting diode LED including a light emitting unit may be disposed in the light emitting element layer EL. The light emitting element layer EL may include a first electrode layer 131 (e.g., a first electrode), intermediate layers 132 and 133, and a second electrode layer 134 (e.g., a second electrode).

In an embodiment, for example, the first electrode layer 131 may function as an anode electrode of the light emitting element OLED/LED. The first electrode layer 131 may include be formed of conductive material. The first electrode layer 131 may include be formed of a transparent electrode, a translucent electrode, or an opaque electrode (e.g., a reflective electrode).

When the first electrode layer 131 includes or is formed of a transparent or translucent electrode, the first electrode layer 131 may include or be made of, e.g., ITO, IZO, ZnO, In2O3, IGO or AZO. When the first electrode layer 131 is provided or formed of a reflective electrode, the first electrode layer 131 may include a reflective film formed of, e.g., Ag, Mg, Al, Pt, Pd, Au, Ni, Nd, Ir, Cr, or an alloy thereof, and a layer formed of indium tin oxide ("ITO"), indium zinc oxide ("IZO"), ZnO, In2O3, indium gallium oxide ("IGO") or aluminum zinc oxide ("AZO"). The disclosure is not limited thereto, and the first electrode layer 131 may include or be formed of various other materials, and the structure thereof may also be changed in various ways; e.g., it may have a single layer structure or a multilayer structure.

A pixel defining layer 135 may be disposed on the planarization layer 128. The pixel defining layer 135 may cover at least a portion of the first electrode layer 131. The pixel defining layer 135 may enclose the periphery of the first electrode layer 131 and thus define an emissive area of each pixel PX. The pixel defining layer 135 may be patterned for each pixel PX. The pixel defining layer 135 may include or be formed of organic or inorganic material, and have a single layer structure or a multilayer structure.

The intermediate layer 132 or 133 may be disposed on an area of the first electrode layer 131 that is exposed out of the pixel defining layer 135.

In the display area DA, the intermediate layer 132 may include an organic light emitting layer. Depending on embodiments, the intermediate layer 132 in the display area DA may further include various functional layers such as a hole injection layer ("HIL"), a hole transport layer ("HTL"), an electron transport layer ("ETL"), and an electron injection layer ("EIL").

In the peripheral area NDA, the intermediate layer 133 may include an inorganic light emitting layer. In an embodiment, for example, in the peripheral area NDA, a light emitting unit LU may be disposed in plurality in the intermediate layer 133 (e.g., light emitting units LU). Each one light emitting unit LU may be a micro-sized light emitting unit, and have, e.g., a configuration illustrated in FIG. 5.

Referring to FIG. 5, the light emitting unit LU may have various three-dimensional shapes including, e.g., a cylindrical shape, a cuboidal shape, and a polyprism shape. FIG. 5 illustrates an example of a light emitting unit LU having a cylindrical shape.

The light emitting unit LU may include a first conductive semiconductor layer 11, a second conductive semiconductor layer 13, and an active layer 12 interposed between the first and second conductive semiconductor layers 11 and 13. In an embodiment, for example, the light emitting unit LU may be implemented as a stacked body formed by successively stacking the first conductive semiconductor layer 11, the active layer 12, and the second conductive semiconductor layer 13.

If the direction in which the light emitting unit LU extends is defined as a longitudinal direction, the light emitting unit LU may have a first end and a second end as opposite ends which are opposite to each other along the longitudinal direction. One of the first and second conductive semiconductor layers 11 and 13 may be disposed at the first end of the light emitting unit LU, and the other of the first and second conductive semiconductor layers 11 and 13 may be disposed at the second end of the light emitting unit LU.

The first conductive semiconductor layer 11 may include, for example, at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn. The material forming the first conductive semiconductor layer 11 is not limited, and the first conductive semiconductor layer 11 may include or be formed of various other materials.

The active layer 12 may be provided or formed on the first conductive semiconductor layer 11 and have a single or multiple quantum well structure. In an embodiment of the disclosure, a cladding layer (not shown) doped with a conductive dopant may be provided or formed on and/or under the active layer 12. In an embodiment, for example, the cladding layer may include or be formed of an ALGaN layer or an InALGaN layer. In addition, material such as AlGaN or AlInGaN may be employed to form the active layer 12. If an electric field of a predetermined voltage or more is applied to the opposite ends of the light emitting unit LU, the light emitting unit LU emits light by coupling of electron-hole pairs in the active layer 12.

The second conductive semiconductor layer 13 may be provided on the active layer 12 and include a semiconductor layer of a type different from that of the first conductive semiconductor layer 11. In an embodiment, for example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg. The material forming the second conductive semiconductor layer 13 is not limited, and the second conductive semiconductor layer 13 may include or be formed of various other materials.

In an embodiment of the disclosure, the light emitting unit LU may not only include the first conductive semiconductor layer 11, the active layer 12, and the second conductive semiconductor layer 13, but may also include a fluorescent layer, another active layer, another semiconductor layer, and/or an electrode layer provided on and/or under each layer.

In an embodiment, the light emitting unit LU may further include an electrode layer (not illustrated) provided on the second conductive semiconductor layer 13. The electrode layer may include metal or metal oxide. In an embodiment, for example, Cr, Ti, Al, Au, Ni, ITO, and an oxide or alloy thereof may be used alone or in combination with each other. However, the disclosure is not limited thereto.

Furthermore, the light emitting unit LU may further include an insulating film 14. In an embodiment of the disclosure, the insulating film 14 as an organic insulating film may be omitted, or may be provided to cover a portion of the first conductive semiconductor layer 11, the active layer 12, and the second conductive semiconductor layer 13. In an embodiment, for example, the insulating film 14 may be provided on a portion of the light emitting unit LU other than the opposite ends thereof so that the opposite ends of the light emitting unit LU may be exposed to outside thereof. Although in FIG. 5 there is illustrated the insulating film 14 which exposes portions of the first conductive semiconductor layer 11, the active layer 12, and the second conductive semiconductor layer 13 for the sake of explanation, the light emitting unit LU may be provided or formed such that the entirety of the side surface of the cylindrical body thereof is enclosed by the insulating film 14. The insulating film 14 may be provided to enclose at least a portion of an outer circumferential surface of the first conductive semiconductor layer 11, the active layer 12, and/or the second conductive semiconductor layer 13, to provide an outer surface of the light emitting unit LU. In an embodiment, for example, the insulating film 14 may be provided to enclose at least the outer circumferential surface of the active layer 12.

In an embodiment of the disclosure, the insulating film 14 may include a transparent insulating material. In an embodiment, for example, the insulating film 14 may include at least one insulating material selected from $SiO_2$, $Si_3N_4$, $Al_2O_3$, and $TiO_2$, but it is not limited thereto. In other words, various materials having insulating properties may be employed.

If the insulating film 14 is provided on the light emitting unit LU, short-circuiting of the active layer 12 with a first and/or second electrode (not illustrated) may be reduced or effectively prevented. Furthermore, owing to the insulating film 14, occurrence of a defect on the surface of the light emitting unit LU may be minimized, whereby the lifetime and efficiency of the light emitting unit LU may be improved. Even when a plurality of light emitting units LU are disposed adjacent to each other, the insulating film 14 may reduce or effectively prevent the light emitting units LU from undesirably short-circuiting therebetween.

The light emitting diode LED including the light emitting unit LU may be relatively highly resistant to external moisture or the like, compared to the organic light emitting diode OLED, and may not be easily degraded. Therefore, in the peripheral area NDA including light emitting diodes LED, a thin-film encapsulation layer TFE disposed on the light emitting element layer EL may have a stacked structure which is relatively thin or in which the total number of layers is reduced, compared to that of display area DA including the organic light emitting diode OLED.

Referring to FIGS. 4 and 5 together, the first conductive semiconductor layer 11 of the light emitting unit LU may be disposed on the first electrode layer 131, such as to be closest thereto among the first conductive semiconductor layer 11, the active layer 12, and the second conductive semiconductor layer 13. In other words, the light emitting unit LU may be oriented such that the first conductive semiconductor layer 11 comes into contact with the first electrode layer 131, and the first conductive semiconductor layer 11, the active layer 12 and the second conductive semiconductor layer 13 are successively stacked. However, the technical spirit of the disclosure is not limited thereto. In an embodiment, for example, the orientation of light emitting unit LU may be changed in various ways depending on a doped state of the first electrode layer 131, the second electrode layer 134, and the light emitting unit LU.

The second electrode layer 134 may be disposed on the intermediate layers 132 and 133. The second electrode layer 134 may function as a cathode electrode of the light emitting element OLED/LED. The second electrode layer 134 may include or be formed of a conductive material, and may be a transparent electrode, a translucent electrode, or an opaque electrode (e.g., a reflective electrode).

When the second electrode layer 134 includes or is formed of a transparent or translucent electrode, the second electrode layer 134 may include a layer including or formed of metal having a relatively low work function, e.g., Li, Ca, LiF/Ca, LiF/Al, Al, Ag, or Mg, or a combination thereof, and a transparent or translucent layer including or formed of ITO, IZO, ZnO, or In2O3. When the second electrode layer 134 include or is formed of a reflective electrode, the second electrode layer 134 may have, e.g., a layer formed of Li, Ca, LiF/Ca, LiF/Al, Al, Ag, Mg, or a combination thereof. The configuration and the material of the second electrode layer 134 are not limited thereto, and may be changed in various ways.

The thin-film encapsulation layer TFE may be disposed on the light emitting element layer EL. The thin-film encapsulation layer TFE is common to each of the light emitting elements OLED/LED. The thin-film encapsulation layer TFE may cover the second electrode layer 134. The thin-film encapsulation layer TFE may have a structure obtained by alternately stacking organic layers and inorganic layers. In an embodiment, for example, in the display area DA, the thin-film encapsulation layer TFE may include a first inorganic layer 141, an organic layer 142, and a second inorganic layer 143. The thin-film encapsulation layer TFE may function to protect the display device DD from penetration of external moisture.

Furthermore, for example, in the peripheral area NDA, the thin-film encapsulation layer TFE may include a first inorganic layer 141 and a second inorganic layer 143. That is, the organic layer 142 of the display area DA may terminate at a position corresponding to a boundary between the display area DA an the peripheral area NDA, such that in the peripheral area NDA, the thin-film encapsulation layer TFE excludes the organic layer 142. As described above, since the light emitting diode LED provided in the peripheral area NDA does not include an organic layer, the light emitting diode LED may be relatively highly resistant to penetration of external moisture, compared to that of the organic light emitting diode OLED provided in the display area DA. Therefore, in the peripheral area NDA, any one of the organic layer 142 and the first and second inorganic layers 141 and 143 as layers of the thin-film encapsulation layer TFE in the display area DA may be omitted.

As such, the organic light emitting diode OLED is vulnerable to penetration of external moisture. Therefore, if organic light emitting diodes OLED are disposed in an entirety of the display device DD, organic light emitting diodes OLED that are disposed in a perimeter of the display device DD may be easily damaged by penetration of external moisture. In various embodiments of the disclosure, since the light emitting element layer EL in the peripheral area NDA includes or is formed of a light emitting diode LED including a light emitting unit LU, a hybrid display device DD capable of emitting light across an entirety of a planar area of the display portion DP-P without damage to the light emitting element may be embodied. Furthermore, in the case of the light emitting unit LU, since a degradation rate of the light emitting element LU is comparatively low, an always on display ("AOD") function may be selectively applied to the peripheral area NDA.

Figure 6:
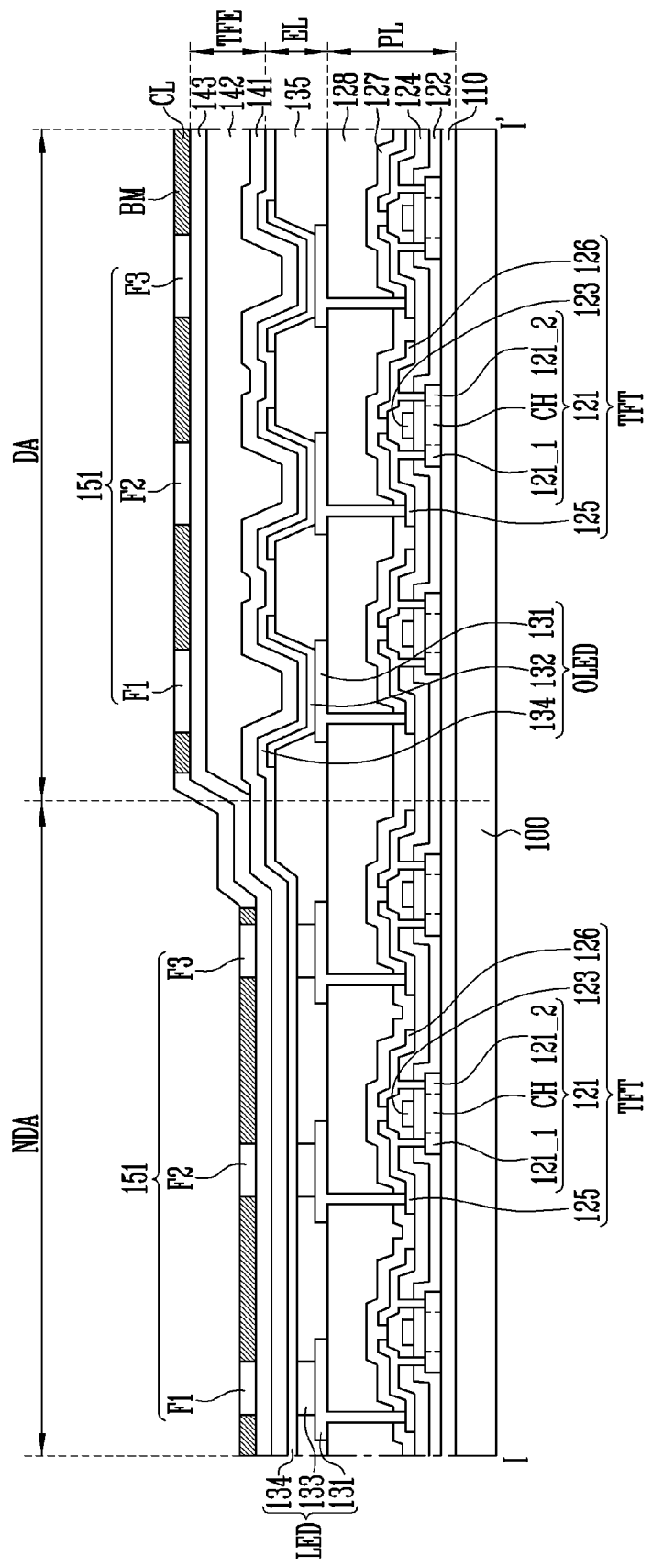
FIG. 6 is a cross-sectional view of a modified embodiment of a display device taken along line I-I' of FIG. 1.

FIG. 6 is a cross-sectional view of a modified embodiment of a display device taken along line I-I' of FIG. 1. The configuration of the embodiment of FIG. 6, except that a color filter layer CL is further provided on the thin-film encapsulation layer TFE, is substantially the same as that of the embodiment of FIG. 4; therefore, like reference numerals are used to designate identical or similar components, and detailed descriptions thereof will be omitted.

In various embodiments of the disclosure, the color filter layer CL may be disposed on the peripheral area NDA. Alternatively, in various embodiments of the disclosure, the color filter layer CL may be disposed on both the display area DA and the peripheral area NDA. In the following embodiments, although the case where the color filter layer CL is disposed on both the display area DA and the peripheral area NDA will be described as a representative example, the technical spirit of the disclosure is not limited thereto. In various embodiments of the disclosure, the color filter layer CL may be provided in only an area in which the light emitting units LU are disposed among a total area of the peripheral area NDA or a total area of the peripheral area NDA and the display area DA together.

Referring to FIG. 6, the color filter layer CL may be provided on the thin-film encapsulation layer TFE. The color filter layer CL may include a plurality of conversion filters 151 and a black matrix BM.

Depending on the energy of light that is incident on the color filter layer CL, the conversion filters 151 may convert the color of the incident light or allow the incident light to pass therethrough without color-conversion. Light provided from the light emitting elements OLED/LED may be converted into light having various colors by the conversion filters 151 (e.g., color conversion filters 151).

Each of the conversion filters 151 may include a plurality of quantum dots. Each of the quantum dots may absorb a portion of incident light and emit light having a specific color, or allow the incident light to pass therethrough without color-conversion. In the case where light that is incident on the conversion filters 151 has energy enough to excite the quantum dots, each of the quantum dots is excited by absorbing a portion of the incident light, and then emits light having a specific color while being stabilized. The emitted light may have a different color from that of the incident light In contrast, where incident light does not have energy enough to excite the quantum dots, the incident light may pass through the conversion filters 151 without color-conversion, and thus be visible to a user as unconverted light.

Each of the quantum dots may be selected from among a group II-VI compound, a group compound, a group IV-VI compound, a group IV element, a group IV compound, and a combination thereof.

The group II-VI compound may be selected from: a binary compound selected from CdSe, CdTe, ZnS, ZnSe, ZnTe, ZnO, HgS, HgSe, HgTe, MgSe, MgS, and a combination thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The group III-V compound may be selected from: a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quanternary compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a combination thereof. The group IV-VI compound may be selected from: a binary compound selected from SnS, SnSe, SnTe, PbS, PbSe, PbTe, and a combination thereof; a ternary compound selected from SnSeS, SnSeTe, SnSTe, PbSeS, PbSeTe, PbSTe, SnPbS, SnPbSe, SnPbTe, and a combination thereof; and a quanternary compound selected from SnPbSSe, SnPbSeTe, SnPbSTe, and a combination thereof. The group IV element may be selected from Si, Ge, and a combination thereof. The group IV compound may be a binary compound selected from SiC, SiGe, and a combination thereof.

The binary compound, the ternary compound, or the quaternary compound may be present in particles at a substantially uniform concentration, or may be present in the same particles with different concentration distributions. Each particle may have a core/shell structure in which one quantum dot is surrounded by other quantum dots. An interface between the core and the shell may have a concentration gradient in which the concentration of elements that are present in the shell decreases in a direction from the surface of the particle to the center of the particle.

The quantum dot may have any shape which is generally used in the art, and is not specifically limited. Specifically, a spherical, pyramid-shaped, multi-arm shaped, or cubic nanoparticle, nanotube, nanowire, nanofiber, and nanoplate particle may be used.

In various embodiments of the disclosure, the conversion filters 151 may include a first conversion filter F1, a second conversion filter F2, and a third conversion filter F3. A black matrix BM may be disposed between adjacent ones among the first conversion filter F1, the second conversion filter F2, and the third conversion filter F3 to define a boundary between the first conversion filter F1, the second conversion filter F2, and the third conversion filter F3.

The first to third conversion filters F1 to F3 may convert light rays that are incident on the color filter layer CL into respective light rays having different wavelength bandwidths.

In an embodiment, respective quantum dots included in the first to third conversion filters F1 to F3 may have different sizes. In other words, the wavelength of light to be generated from each quantum dot may be determined depending on the particle size of the quantum dot. Among the first conversion filter F1, the second conversion filter F2, and the third conversion filter F3, the second conversion filter F2 may include quantum dots having the largest particle size, and the third conversion filter F3 may include quantum dots having the smallest particle size. In an embodiment of the disclosure, the third conversion filter F3 may not include quantum dots.

However, the invention is not limited thereto. In an embodiment, for example, the conversion filters 151 may be configured such that any one or more of the first to third conversion filters F1 to F3 is omitted. In this embodiment, in an area where a conversion filter 151 and a black matrix BM are not disposed, light generated from the light emitting elements OLED/LED may be directly visible to the user. In an embodiment, for example, the light emitting elements OLED/LED may generate blue light, and the conversion filters 151 may convert the blue light into red light or green light.

The black matrix BM may be disposed adjacent to the conversion filters 151. The black matrix BM may include or be formed of light shielding material. The black matrix BM may reduce or effectively prevent light from leaking through an area other than a pixel area (not shown) through which light is emitted, and define a boundary between adjacent pixel areas. The pixel area may be a portion of the pixel PX at which light is emitted.

Figure 7:
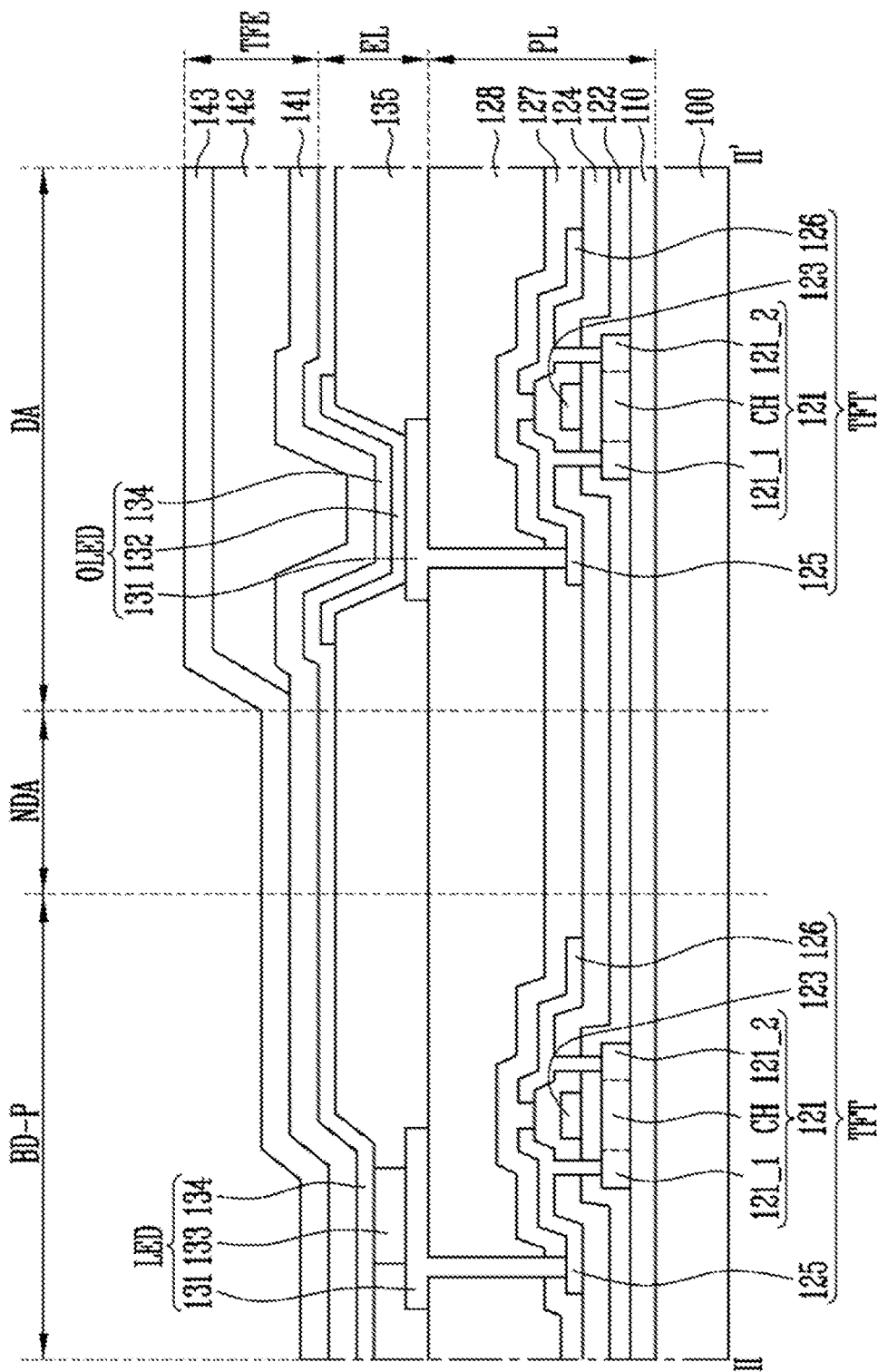
FIG. 7 is a cross-sectional view taken along line II-II' of FIG. 1 of the display device, which is unfolded.

FIG. 7 is a cross-sectional view taken along line II-IF of FIG. 1 of the display device DD, which is unfolded or flat. Although FIG. 7 illustrates the display device DD unfolded for the sake of explanation, the display device DD may be bent at the bending portion BD-P, as illustrated in FIG. 2.

Referring to FIGS. 1 and 7 together, the display device DD may include a substrate 100, and various elements provided on the substrate 100.

The substrate 100 may include a display portion DP-P and a bending portion BD-P. The display portion DP-P may include a display area DA and a peripheral area NDA.

In various embodiments of the disclosure, each of the display area DA and the bending portion BD-P may include pixels PX each of which includes a light emitting element OLED/LED. In these embodiments, each of the pixels PX that are provided in the display area DA may include an organic light emitting diode OLED as a light emitting element. Each of the pixels PX that are provided in the bending portion BD-P may include, as a light emitting element, a light emitting diode LED formed of a light emitting unit LU.

A pixel circuit layer PL and a light emitting element layer EL are disposed on the substrate 100. The pixel circuit layer PL may include a buffer layer 110, and a transistor TFT which is disposed on the buffer layer 110. In various embodiments of the disclosure, the transistor TFT may be a driving transistor for driving the light emitting element OLED/LED provided in the light emitting element layer EL, or a switching transistor for switching the driving transistor. In more detail, the transistor TFT may be a transistor for driving the organic light emitting diode OLED provided in the light emitting element layer EL in the display area DA, or the light emitting diode LED provided in the bending portion BD-P. In the embodiment of FIG. 7, the structure of the pixel circuit layer PL is the same as that described with reference to FIG. 4; therefore, detailed description thereof will be omitted.

The light emitting element layer EL may be provided or formed on the pixel circuit layer PL. In the display area DA, the organic light emitting diode OLED may be disposed in the light emitting element layer EL. In the bending portion BD-P, the light emitting diode LED including a light emitting unit LU may be disposed in the light emitting element layer EL.

In an embodiment of FIG. 7, the structure of the light emitting element layer EL, other than the light emitting diode LED including the light emitting unit LU being formed in the bending portion BD-P, is substantially the same as that described with reference to FIG. 4; therefore, detailed description thereof will be omitted.

Although FIG. 7 illustrates an example in which no light emitting element is present in the peripheral area NDA, the invention is not limited thereto. In an embodiment, for example, in various embodiments, at least one transistor for driving the light emitting elements OLED/LED disposed in the display area DA and/or the bending portion BD-P may be disposed in the peripheral area NDA. Alternatively, in various embodiments, at least one metal line, conducive line, metal or conductive signal line, or the like may be provided or formed in the interlayer insulating layer 124 of the peripheral area NDA.

Furthermore, FIG. 7 illustrates an embodiment where the light emitting elements OLED/LED are provided in the display area DA and the bending portion BD-P, and the light emitting elements OLED/LED are not provided in the peripheral area NDA. However, the invention is not limited thereto. In other words, in various embodiments of the disclosure, the light emitting elements OLED/LED may be provided at each of the display area DA, the peripheral area NDA, and the bending portion BD-P. In these embodiments, organic light emitting diodes OLED may be disposed in the display area DA, and light emitting units LU may be disposed in both the peripheral area NDA and the bending portion BD-P, as illustrated in FIGS. 4 to 6.

Figure 8:
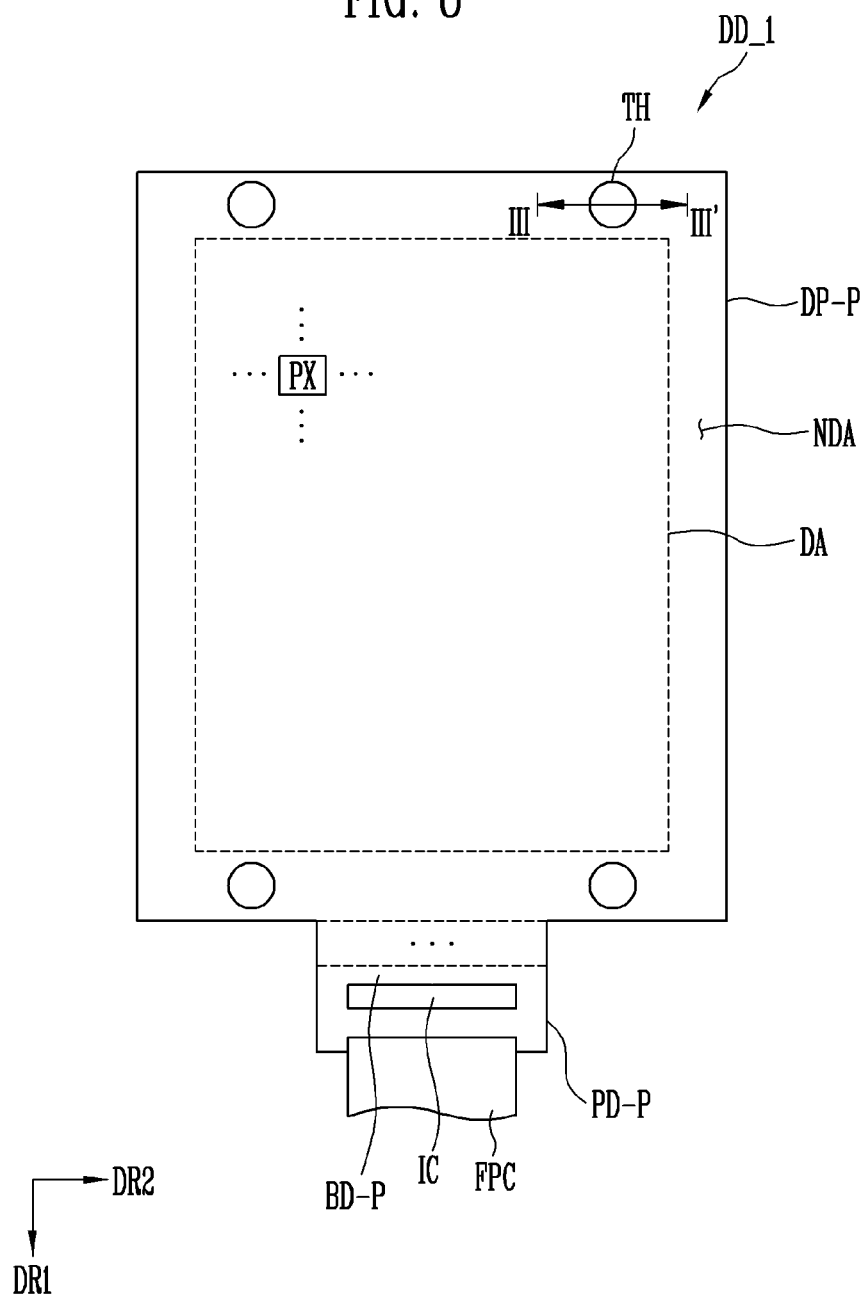
FIG. 8 is a plan view schematically illustrating another embodiment of a display device.
Figure 9:
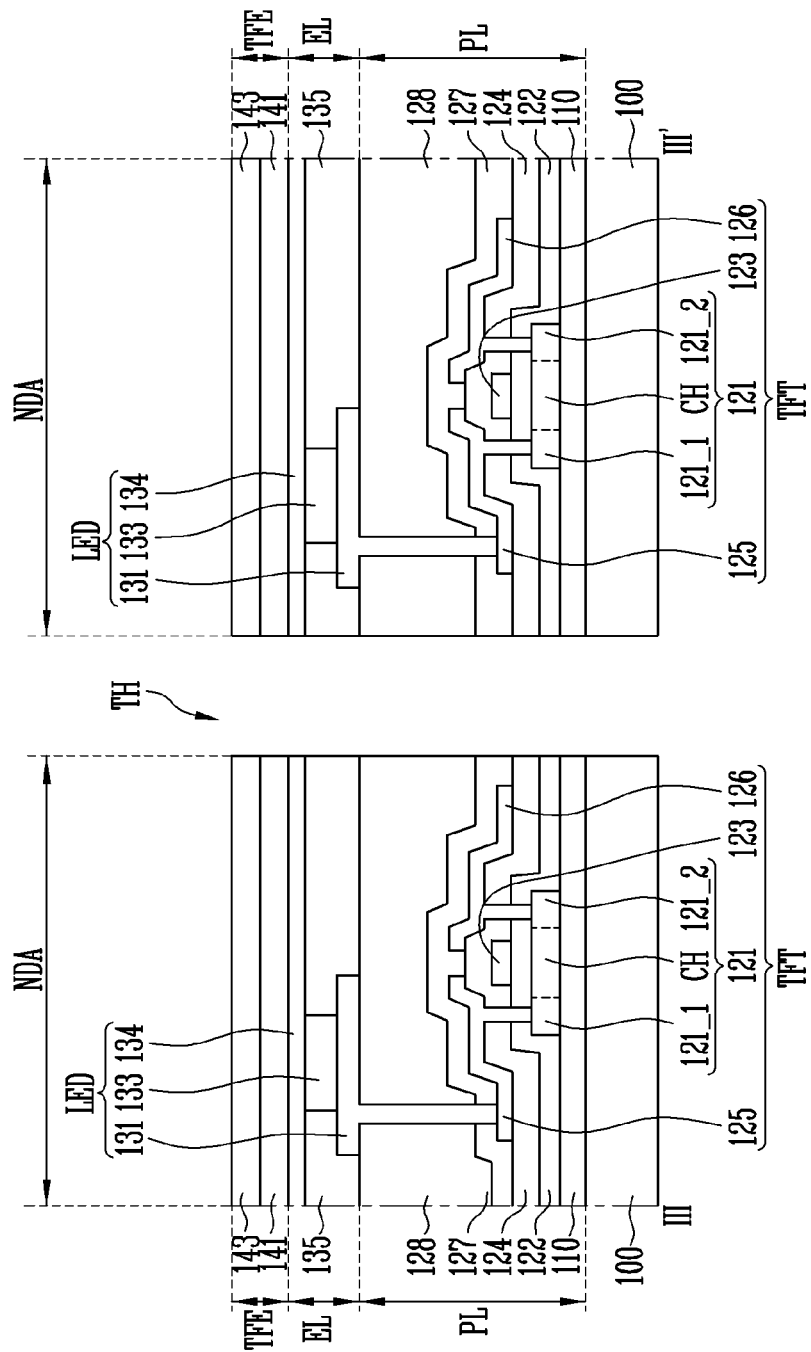
FIG. 9 is a cross-sectional view taken along line III-III' of FIG. 8.

FIG. 8 is a plan view schematically illustrating another embodiment of a display device DD_1. FIG. 9 is a cross-sectional view taken along line III-III' of FIG. 8. FIG. 9 is an enlarged cross-sectional view illustrating the peripheral area NDA including a through hole TH of the display device DD_1. In FIG. 8, for the sake of explanation, lines and drivers which are shown in FIG. 1, are omitted.

Referring to FIGS. 8 and 9, the display device DD_1 may include a display portion DP-P, a bending portion BD-P, and a pad portion PD-P. The display device DD_1, except that at least one through hole TH is provided or formed in the peripheral area NDA of the display portion DP-P, is substantially the same as the display device DD illustrated in FIG. 1. Hence, in the following descriptions, like reference numerals will be used to designate components identical with those of the display device DD illustrated in FIG. 1, and detailed descriptions thereof will be omitted.

The through hole TH may pass through layers of the display device DD_1, such as the substrate 100, the thin-film encapsulation layer TFE, and layers interposed therebetween. The through hole TH is be disposed in the peripheral area NDA and enclosed by a plurality of pixels PX in the plan view. While the horizontal direction in FIG. 9 may represent the second direction DR2 shown in FIG. 8, the invention is not limited thereto. In an embodiment, for example, the structure along the horizontal direction in FIG. 9 may be applied to both the first direction DR1 and the second direction DR2 shown in FIG. 8. That is, the through hole TH may have pixels PX at opposing sides along the first direction DR1, the second direction DR2 and/or a direction inclined with respect to the first direction DR1 and/or the second direction DR2, so as to be enclosed by pixels PX.

The through hole TH may be provided or formed in the peripheral area NDA by a cutting and/or punching apparatus such as using a laser or the like. Depending on embodiments, multilayer patterns may be provided or formed around the through hole TH so as to reduce or effectively prevent a crack from occurring around the through hole TH due to a shock or the like during a process of forming the through hole TH, and reduce or effectively prevent such crack from propagating toward the pixels PX.

The through hole TH is enclosed by layers within the peripheral area NDA, and the pixels PX are provided in the peripheral area NDA. The through hole TH is provided or formed to pass through the substrate 100, the thin-film encapsulation layer TFE, and layers interposed therebetween.

Each of the pixels PX of the peripheral area NDA that enclose the through hole TH may include a light emitting diode LED formed of a light emitting unit LU, as illustrated in FIGS. 4 to 6. FIG. 9 illustrates a representative example in which the light emitting diode LED includes a light emitting unit LU in the peripheral area NDA.

Although FIGS. 8 and 9 illustrate an example where four through holes TH are provided or formed in the peripheral area NDA, the disclosure is not limited thereto. The through holes TH may be disposed at any positions along the peripheral area NDA, and detailed positions and/or number of the through holes TH are not specifically limited.

Although FIGS. 8 and 9 illustrates the case where the through hole TH has a circular planar shape in the plan view, the through hole TH may have various planar shapes such as a rectangular shape, a polygonal shape, and an elliptical shape.

Figure 10:
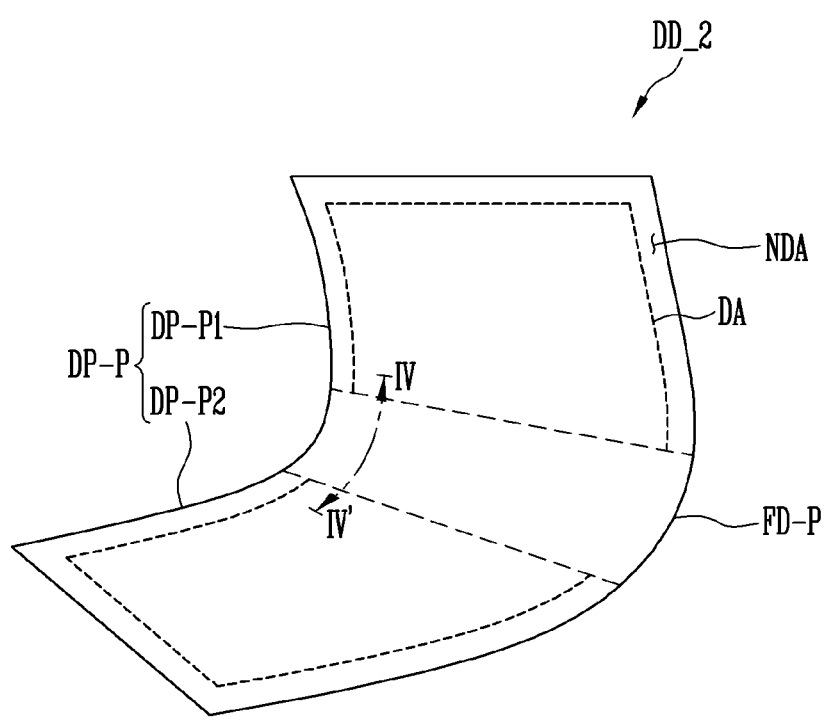
FIG. 10 is a plan view schematically illustrating still another embodiment of a display device.
Figure 11:
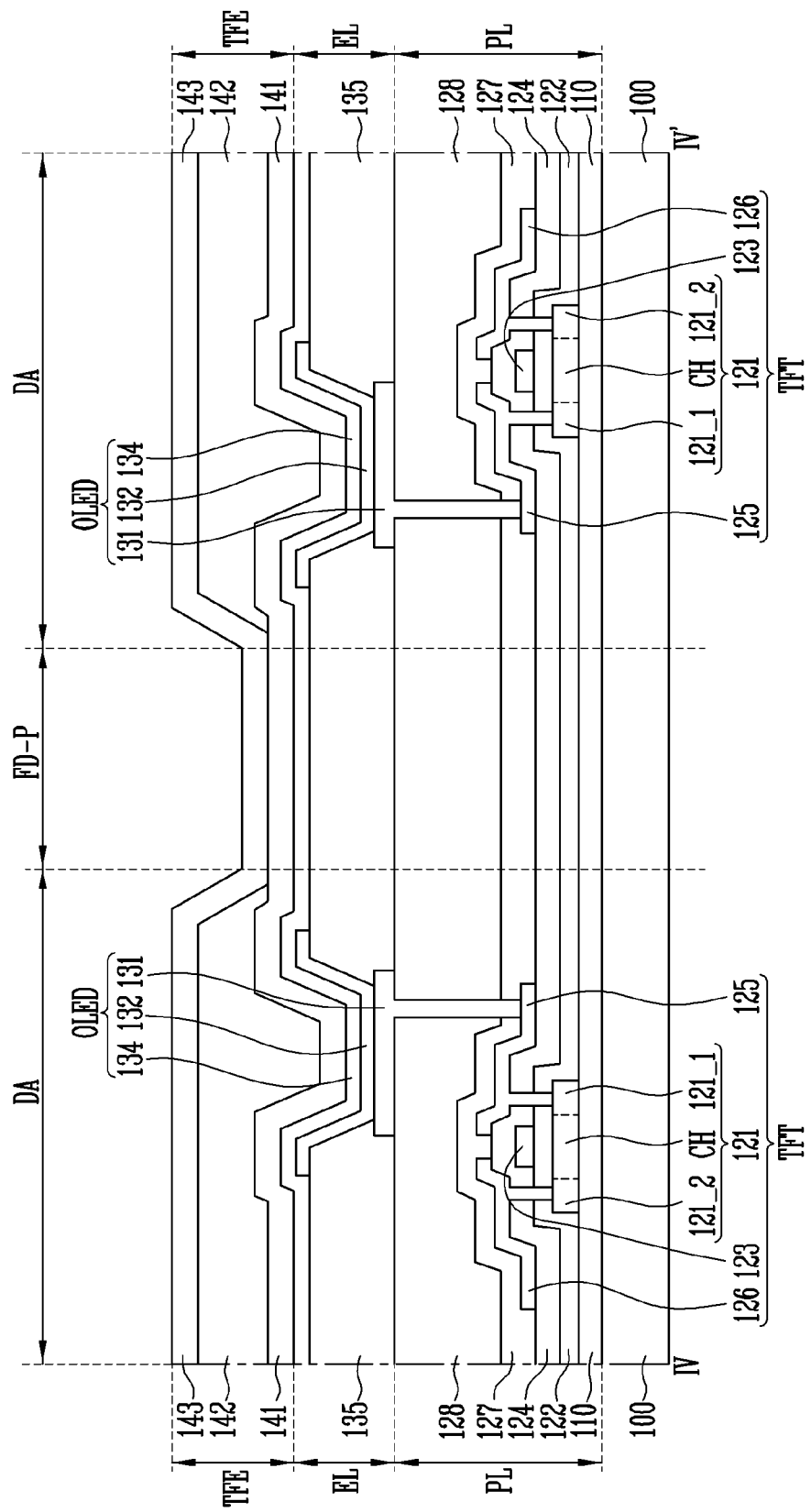
FIG. 11 is a cross-sectional view taken along line IV-IV' of FIG. 10.

FIG. 10 is a plan view schematically illustrating still another embodiment of a display device DD_2. FIG. 11 is a cross-sectional view taken along line IV-IV' of FIG. 10. Particularly, FIG. 10 illustrates a folding portion FD-P of the display device DD_2 at which the display device DD_2 is foldable. FIG. 11 is an enlarged cross-sectional view illustrating portions of the display area DA disposed on opposite sides of the folding portion FD-P of the display device DD_2.

Referring to FIGS. 10 and 11, the display device DD_2 in accordance with an embodiment of the disclosure may include a display portion DP-P and the folding portion FD-P. The folding portion FD-P may be considered a portion of the peripheral area NDA, without being limited thereto.

The display portion DP-P may be divided into a first sub-display portion DP-P1 and a second sub-display portion DP-P2 that are provided on opposite sides of the folding portion FD-P. The first sub-display portion DP-P1 and the second sub-display portion DP-P2 may otherwise be referred to as a plurality of sub-areas. In various embodiments, the first sub-display portion DP-P1 and the second sub-display portion DP-P2 may be provided or formed in identical or different types. In an embodiment, for example, at least one of the first sub-display portion DP-P1 and the second sub-display portion DP-P2 may be implemented as a flexible type in the same manner as the folding portion FD-P. Alternatively, at least one of the first sub-display portion DP-P1 and the second sub-display portion DP-P2 may be provided or formed as a transparent portion. However, the invention is not limited to the examples described above.

Each of the first sub-display portion DP-P1 and the second sub-display portion DP-P2 may include a display area DA and a peripheral area NDA. In this embodiment, each of the first sub-display portion DP-P1 and the second sub-display portion DP-P2 may have the same structure as that illustrated in FIGS. 4 to 6.

The folding portion FD-P is provided between the first and second sub-display portions DP-P1 and DP-P2. Although FIGS. 10 and 11 illustrate an example where one of the folding portion FD-P is provided between two of the sub-display portions DP-P1 and DP-P2, the invention is not limited thereto. For instance, in various embodiments, the number of sub-display portions DP-P1 and DP-P2 included in the display device DD_2 may be increased, and a folding portion FD-P may be respectively disposed between the sub-display portions DP-P1 and DP-P2.

The display device DD_2 may be foldable at the folding portion FD-P. The display device DD_2 may include at least one sensor for sensing a folding operation of the folding portion FD-P. The sensor may be configured to sense variation in electrical value such as resistance, capacitance and/or a magnetic field. The display device DD_2 may sense folding or unfolding information through the sensor and control images to be displayed on the sub-display portions DP-P1 and DP-P2 in response to the sensed information. The folding or unfolding information may include, for example, a folding angle, a folding direction, and a folding position.

In FIG. 10, for the sake of explanation, illustration of components provided in the display device DD_2 is omitted. In various embodiments, the display device DD_2 may include the same internal components as those illustrated in FIG. 1.

In various embodiments, the folding portion FD-P may be provided or formed extended lengthwise along the first direction DR1 or the second direction DR2 of FIG. 1. In an embodiment, where the folding portion FD-P lengthwise extends along the first direction DR1, a separate bending portion BD-P and a separate pad portion PD-P may be provided for each of the sub-display portions DP-P1 and DP-P2 that are separated by the folding portion FD-P.

Referring to FIG. 11, the display device DD_2 may include a substrate 100, and various elements provided on the substrate 100.

The substrate 100 may include a display portion DP-P and a folding portion FD-P. The display portion DP-P may include a display area DA and a peripheral area NDA.

In various embodiments of the disclosure, each of the display area DA and the folding portion FD-P may include pixels PX each of which includes a light emitting element OLED/LED. As including pixels PX, the folding portion FD-P may be considered as a portion of the peripheral area NDA without being limited thereto. In these embodiments, each of the pixels PX that are provided in the display area DA may include an organic light emitting diode OLED as a light emitting element. Each of the pixels PX that are provided in the folding portion FD-P may include, as a light emitting element, a light emitting diode LED formed of a light emitting unit LU.

A pixel circuit layer PL and a light emitting element layer EL are disposed on the substrate 100. The pixel circuit layer PL may include a buffer layer 110, and a transistor TFT which is disposed on the buffer layer 110. In various embodiments of the disclosure, the transistor TFT may be a driving transistor for driving the light emitting element OLED/LED provided on the light emitting element layer EL, or a switching transistor for switching the driving transistor. In more detail, the transistor TFT may be a transistor for driving the organic light emitting diode OLED provided in the light emitting element layer EL in the display area DA, or the light emitting diode LED provided in the folding portion FD-P. In the embodiment of FIG. 11, the structure of the pixel circuit layer PL is the same as that described with reference to FIG. 4; therefore, detailed description thereof will be omitted.

The light emitting element layer EL may be provided or formed on the pixel circuit layer PL. In the display area DA, the organic light emitting diode OLED may be disposed in the light emitting element layer EL. In the folding portion FD-P, the light emitting diode LED including a light emitting unit LU may be disposed in the light emitting element layer EL.

In an embodiment of FIG. 11, the structure of the light emitting element layer EL, other than the light emitting diode LED including the light emitting unit LU being formed in the folding portion FD-P, is substantially the same as that described with reference to FIG. 4; therefore, detailed description thereof will be omitted.

Although FIGS. 10 and 11 illustrate an example where the display area DA is provided on opposite sides of the folding portion FD-P, the invention is not limited thereto. In an embodiment, for example, in various embodiments, at least one side of the folding portion FD-P may be enclosed by the peripheral area NDA. That is, the peripheral area NDA may be disposed between the folding portion FD-P and the display area DA. In these embodiments, light emitting units LU may be disposed in the peripheral area NDA, as illustrated in FIGS. 4 to 6.

Various embodiments provide a hybrid display device which includes both an organic light emitting diode and a light emitting diode as light emitting elements which emit light for displaying an image, thus making it possible to display an image on an entire surface of a screen of the hybrid display device. In various embodiments, a first area may include the display area DA described above, and a second area may include one or more among the peripheral area NDA, the bending portion BD-P and the folding portion FD-P described above. Since pixels PX may be disposed in each of the first area and the second area, both the first area and the second area may be respectively considered as a first display area and a second display area, at which an image is displayed or light is emitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
   a substrate comprising a first display area and a second display area which is closer to an edge of the display device than the first display area;
   a light emitting element layer comprising:
      a first light emitting element in the first display area of the substrate, the first light emitting element comprising a first electrode, an organic light emitting layer and a second electrode, and
      a second light emitting element disposed in the second display area of the substrate, the second light emitting element comprising a first electrode, an inorganic light emitting layer and a second electrode; and
   a thin-film encapsulation layer on the light emitting element layer.

2. The display device according to claim 1, wherein the inorganic light emitting layer of the second light emitting element comprises a light emitting unit including:
   a first conductive semiconductor layer doped with a first conductive dopant;
   a second conductive semiconductor layer doped with a second conductive dopant; and
   an active layer disposed between the first conductive semiconductor layer and the second conductive semiconductor layer.

3. The display device according to claim 2, wherein within the second light emitting element,
   one among the first conductive semiconductor layer and the second conductive semiconductor layer contacts the first electrode of the second light emitting element, and the other one among the first conductive semiconductor layer and the second conductive semiconductor layer contacts the second electrode of the second light emitting element.

4. The display device according to claim 2, wherein the light emitting unit of the second light emitting element comprises a micro light emitting diode.

5. The display device according to claim 1, wherein the second display area which is closer to the edge of the display device than the first display area, encloses the first display area in a plan view.

6. The display device according to claim 1, further comprising a color filter layer comprising quantum dots, the thin-film encapsulation layer being disposed between the color filter layer and the light emitting element layer.

7. The display device according to claim 6, wherein in the second display area, the color filter layer comprises a color conversion filter which color-converts light incident thereto, the color conversion filter corresponding to the second light emitting element.

8. The display device according to claim 1, further comprising:
- a pad portion through which an electrical signal is provided to the first display area, the pad portion including an integrated circuit chip, and
- a bending area at which the display device is bendable, wherein the bending area connects the first display area or the second display area to the pad portion.

9. The display device according to claim 1, further comprising in the second display area, a through hole extending through the substrate and the thin-film encapsulation layer.

10. The display device according to claim 1, further comprising:
- the first display area provided in plurality to define a plurality of sub-areas, and
- the second display area comprises a bending area at which the display device is bendable, the bending area connecting the plurality of sub-areas to each other.

11. The display device according to claim 1, wherein the thin-film encapsulation layer includes a plurality of inorganic layers.

12. The display device according to claim 11, wherein
in the first display area, the thin-film encapsulation layer includes an organic layer between the plurality of inorganic layers, and
in the second display area, the thin-film encapsulation layer excludes the organic layer.

13. The display device according to claim 1, wherein the first light emitting element comprises an organic light emitting diode.

14. A display device comprising:
- a substrate comprising a first display area and a second display area which is closer to an outer edge of the display device than the first display area;
- a first light emitting element in the first display area of the substrate, the first light emitting element including an organic light emitting layer; and
- a second light emitting element in the second display area of the substrate, the second light emitting element including an inorganic light emitting layer.

15. The display device according to claim 14, wherein the second light emitting element comprises a light emitting unit in the inorganic light emitting layer, the light emitting unit comprising:
- a first conductive semiconductor layer doped with a first conductive dopant;
- a second conductive semiconductor layer doped with a second conductive dopant; and
- an active layer disposed between the first conductive semiconductor layer and the second conductive semiconductor layer.

16. The display device according to claim 14, wherein an outer edge of the second display area corresponds to the outer edge of the display device.

17. The display device according to claim 14, further comprising a thin-film encapsulation layer including an organic layer between a plurality of inorganic layers,
wherein
in the first display area, the first light emitting element including the organic light emitting layer is between the substrate and the organic layer of the thin-film encapsulation layer, and
in the second display area:
the thin-film encapsulation layer includes the plurality of inorganic layers and excludes the organic layer, and
the second light emitting element including the inorganic light emitting layer is between the substrate and the thin-film encapsulation layer.

18. The display device according to claim 14, wherein
the second display area comprises a bending area at which the display device is bendable, and
the second light emitting element including the inorganic light emitting layer is disposed in the bending area.

* * * * *